US009082980B2

(12) United States Patent
Suzuki et al.

(10) Patent No.: US 9,082,980 B2
(45) Date of Patent: Jul. 14, 2015

(54) MANUFACTURING METHOD FOR ELECTROLUMINESCENT ELEMENT

(71) Applicants: Masahiro Suzuki, Tokyo (JP); Yusuke Yamazaki, Tokyo (JP)

(72) Inventors: Masahiro Suzuki, Tokyo (JP); Yusuke Yamazaki, Tokyo (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 14/381,470

(22) PCT Filed: Feb. 28, 2013

(86) PCT No.: PCT/JP2013/055529
§ 371 (c)(1),
(2) Date: Aug. 27, 2014

(87) PCT Pub. No.: WO2013/129612
PCT Pub. Date: Sep. 6, 2013

(65) Prior Publication Data
US 2015/0132864 A1 May 14, 2015

(30) Foreign Application Priority Data
Feb. 29, 2012 (JP) ................. 2012-044537

(51) Int. Cl.
H01L 21/20 (2006.01)
H01L 51/00 (2006.01)
H01L 51/56 (2006.01)
(52) U.S. Cl.
CPC ............ H01L 51/0031 (2013.01); H01L 51/56 (2013.01)
(58) Field of Classification Search
CPC .................................................. H01L 21/0254
See application file for complete search history.

(56) References Cited

U.S. PATENT DOCUMENTS 6,805,448 B2 * 10/2004 Yokoyama et al. ............. 353/85
6,856,089 B2    2/2005 Hosokawa et al.
8,497,497 B2 *  7/2013 Nakajima et al. ............. 257/40
2013/0161664 A1 6/2013 Tajima et al.

FOREIGN PATENT DOCUMENTS

JP      2006-18169 A    1/2006
JP      2006-18170 A    1/2006
(Continued)

OTHER PUBLICATIONS

International Search Report for PCT/JP2013/055529 dated Apr. 23, 2013.

Primary Examiner — Zandra Smith
Assistant Examiner — Andre' C Stevenson
(74) Attorney, Agent, or Firm — Sughrue Mion, PLLC

(57) ABSTRACT

A method for manufacturing an electroluminescent element including: a first manufacturing step of layering on a substrate, in the following order, a first electroconductive layer, a dielectric layer in which plural contact holes are formed which pass therethrough in a direction orthogonal to the substrate, a second electroconductive layer which is electrically connected to the first electroconductive layer inside the contact holes and which fills the contact holes, a light-emitting layer, and a third electroconductive layer; a temperature distribution measurement step of applying a voltage to the first electroconductive layer and the third electroconductive layer, causing the light-emitting layer to emit light, and measuring the temperature distribution of the electroluminescent element to obtain temperature unevenness information for the electroluminescent element; and a second manufacturing step of adjusting, the basis of the temperature unevenness information, the density of the plural contact holes that pass through the dielectric layer.

5 Claims, 6 Drawing Sheets

FOREIGN PATENT DOCUMENTS

| | | |
|---|---|---|
| JP | 2006-30336 A | 2/2006 |
| JP | 2011-203314 A | 10/2011 |
| JP | 4913927 B2 | 4/2012 |
| WO | 00/67531 A1 | 11/2000 |

* cited by examiner

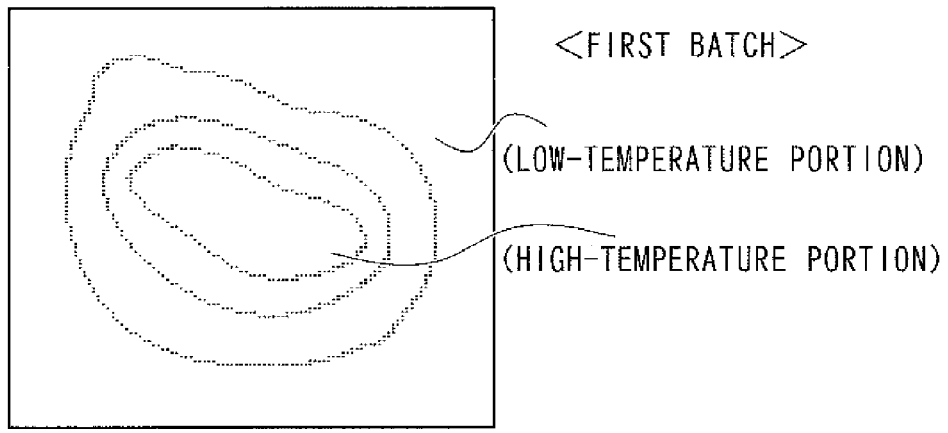
FIG.6A  <FIRST BATCH>
(LOW-TEMPERATURE PORTION)
(HIGH-TEMPERATURE PORTION)
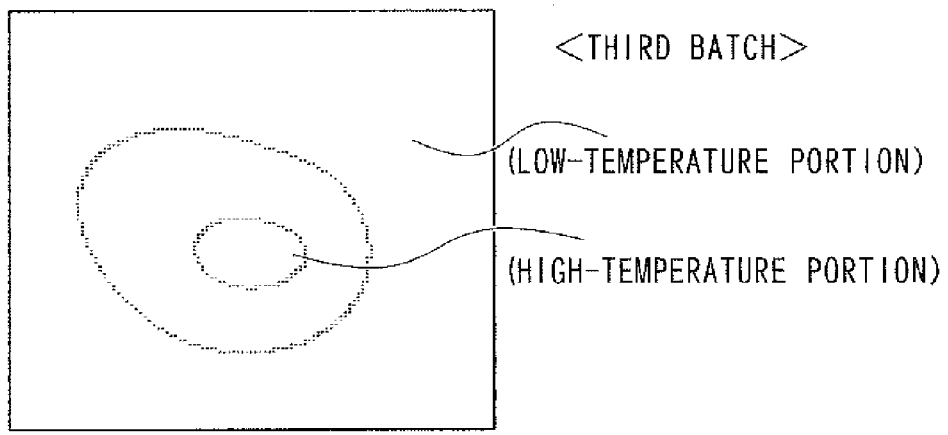
FIG.6B  <THIRD BATCH>
(LOW-TEMPERATURE PORTION)
(HIGH-TEMPERATURE PORTION)
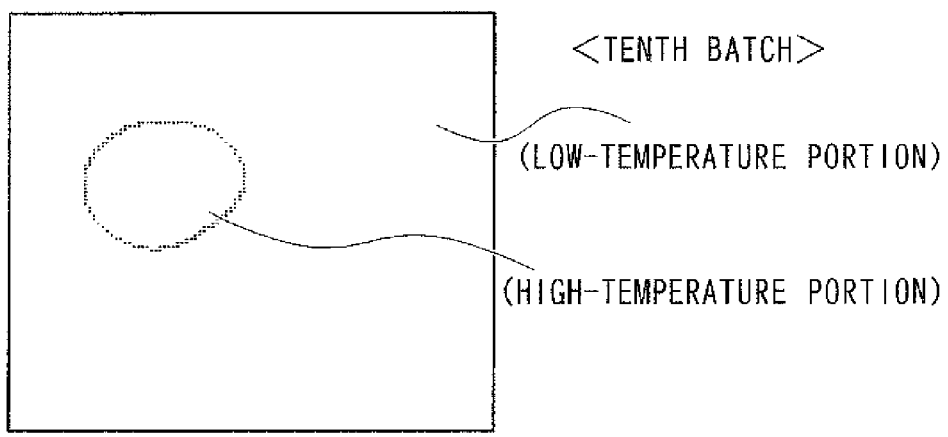
FIG.6C  <TENTH BATCH>
(LOW-TEMPERATURE PORTION)
(HIGH-TEMPERATURE PORTION)

MANUFACTURING METHOD FOR ELECTROLUMINESCENT ELEMENT

CROSS REFERENCE TO RELATED APPLICATIONS

This application is a National Stage of International Application No. PCT/JP2013/055529 filed Feb. 28, 2013, claiming priority based on Japanese Patent Application No. 2012-044537 filed Feb. 29, 2012, the contents of all of which are incorporated herein by reference in their entirety.

TECHNICAL FIELD

The present invention relates to a manufacturing method for an electroluminescent element.

BACKGROUND ART

Conventionally, as an electroluminescent element, there is known an organic layer including a light-emitting layer that is formed to be interposed between a cathode and an anode, in which the light-emitting layer in a region where the anode and the cathode overlap emits light by application of voltage between these electrodes.

In recent years, there has been a report on an organic electroluminescent element in which an organic light-emitting medium is provided between a first electrode (an anode or a cathode) and a semiconductor layer configured with a non-single-crystal material and a second electrode (a cathode or an anode) is electrically connected to an edge portion of the semiconductor layer, to thereby take out electroluminescent light emission from the semiconductor layer to the outside without substantially causing the first electrode and the second electrode face each other (refer to Patent Document 1).

CITATION LIST

Patent Literature

Patent Document 1: International Publication WO00/67531 Brochure

DISCLOSURE OF INVENTION

Technical Problem

By the way, in a case where an organic electroluminescent element having a structure described in Patent Document 1 is manufactured, it is required to form a semiconductor layer that is in contact with an electrode formed by fine patterning. Accordingly, it is possible to take out light emission to the outside without causing a cathode and an anode to face each other; however, it is difficult to form a smooth semiconductor layer, manufacturing steps become complex, and light emission in a light-emitting surface is apt to be non-uniform.

On the other hand, in the case of a conventional electroluminescent element, temperature unevenness occurs in the light-emitting surface depending on manufacturing steps, and accordingly, life as an element is shortened in some cases.

An object of the present invention is to provide a manufacturing method for an electroluminescent element that is capable of reducing temperature unevenness in a light-emitting surface, to thereby obtain a long-life electroluminescent element.

Solution to Problem

According to the present invention, there is provided a manufacturing method for an electroluminescent element including: first manufacturing of an electroluminescent element (a first manufacturing step) that manufactures an electroluminescent element in which, on a substrate, a first electroconductive layer, a dielectric layer with plural contact holes passing through in a direction orthogonal to the substrate formed therein, a second electroconductive layer that is electrically connected to the first electroconductive layer inside the contact holes and fills the contact holes, a light-emitting layer and a third electroconductive layer are successively laminated; a temperature distribution measurement step that applies a voltage to the first electroconductive layer and the third electroconductive layer of the electroluminescent element manufactured in the first manufacturing step to cause the light-emitting layer to emit light, and measures temperature distribution of the electroluminescent element to obtain temperature unevenness information of the electroluminescent element; and second manufacturing of an electroluminescent element (a second manufacturing step) that adjusts a density of the plural contact holes passing through the dielectric layer based on the temperature unevenness information, to thereby reduce temperature unevenness of the electroluminescent element.

Here, it is preferable that, in the temperature distribution measurement step, as the temperature unevenness information, a highest temperature ($T_H$) and a lowest temperature ($T_L$) of the electroluminescent element caused to emit light are measured.

It is preferable that, in the temperature distribution measurement step, based on the temperature unevenness information, a difference ($T_H$-$T_L$) between a highest temperature ($T_H$) and a lowest temperature ($T_L$) of the electroluminescent element caused to emit light is obtained as temperature unevenness.

It is preferable that, in the temperature distribution measurement step, a threshold value is set to not more than 3° C., and in a case where the temperature unevenness is more than a threshold value, the temperature unevenness information is fed back to the first manufacturing step.

It is preferable that, in the first manufacturing step and the second manufacturing step, the plural contact holes are formed so that a number of the contact holes is not less than $10^2$ per a light-emitting region based on light emission in the light-emitting layer, and a ratio of a total area occupied by the plural contact holes to an area of the light-emitting region is not more than 0.2.

Advantageous Effects of Invention

According to the present invention, it is possible to reduce temperature unevenness in an electroluminescent element, to thereby seek to obtain long-life characteristics.

BRIEF DESCRIPTION OF DRAWINGS

FIGS. 6A to 6C are diagrams illustrating temperature distribution of the electroluminescent element.

DESCRIPTION OF EMBODIMENTS

Hereinafter, exemplary embodiments according to the present invention will be described in detail. It should be noted that the present invention is not limited to the following exemplary embodiments, but may be practiced as various modifications within the scope of the gist of the invention. In other words, unless otherwise specified, dimensions, materials, shapes or relative arrangement of components described in the specific examples of the exemplary embodiments do not limit the scope of the present invention, but are merely descriptive specific examples. Further, each of the figures to be used indicates a specific example for illustration of each exemplary embodiment, and does not represent an actual size thereof. Moreover, in this specification, a phrase such as "above (on or over) a layer" is not only limited to a case of being formed on a layer in contact therewith, but also used to include a case of being formed above a layer with some separation, or a case including some layer being interposed between layers.

<Electroluminescent Element>

Figure 1:
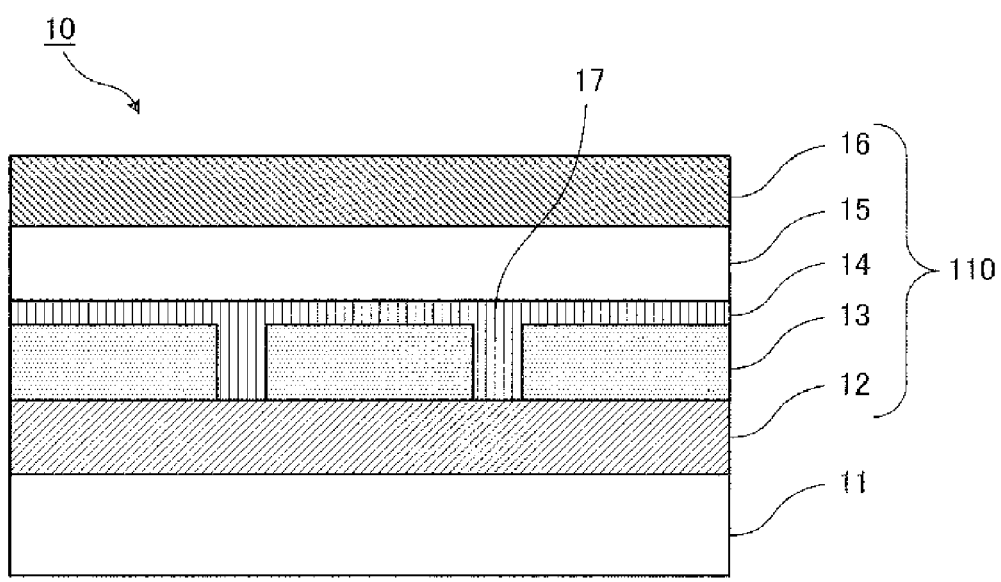
FIG. 1 is a partial cross-sectional view illustrating a specific example of a light-emitting region of an electroluminescent element to which the exemplary embodiment is applied.

FIG. 1 is a partial cross-sectional view illustrating a specific example of a light-emitting region of an electroluminescent element 10, which is a subject for the exemplary embodiment.

The electroluminescent element 10 shown in FIG. 1 includes a substrate 11 and a lamination section 110 formed on the substrate 11. In the lamination section 110, there are laminated in order from the substrate 11 side: a first electroconductive layer 12 for injecting holes; a dielectric layer 13 having insulation properties; a second electroconductive layer 14 that covers the top surface of the dielectric layer 13; a light-emitting layer 15 that emits light upon coupling the holes and electrons; and a third electroconductive layer 16 for injecting the electrons.

As shown in FIG. 1, in the dielectric layer 13 of the electroluminescent element 10, plural contact holes 17 that pass through the dielectric layer 13 in a direction orthogonal to the substrate 11 are provided. Inside of each contact hole 17 is filled with a component constituting the second electroconductive layer 14.

In the exemplary embodiment, the contact hole 17 is filled only with the component of the second electroconductive layer 14. This connects the first electroconductive layer 12 and the second electroconductive layer 14 electrically inside the contact holes 17. Consequently, by applying the a voltage between the first electroconductive layer 12 and the third electroconductive layer 16, a voltage is applied between the second electroconductive layer 14 and the third electroconductive layer 16, to thereby cause the light-emitting layer 15 to emit light.

In this case, a surface of the light-emitting layer 15 on the substrate 11 side, a surface on the third electroconductive layer 16 side, which is opposite to the substrate 11 side, or both of these surfaces become the light-emitting surfaces from which light is taken out of the electroluminescent element 10. Moreover, in a case of being viewed from the surface on the substrate 11 side of the electroluminescent 10, or, in a case of being viewed from the surface on the third electroconductive layer 16 of the electroluminescent element 10, the light-emitting layer 15 emits light as a continuous light-emitting region.

It should be noted that, as another exemplary embodiment, the contact hole 17 may be filled with the components of the second electroconductive layer 14 and others by forming the second electroconductive layer 14 and further forming other components, such as the light-emitting layer 15, so as to contact the contact hole 17.

(Substrate 11)

The substrate 11 serves as a support body that forms the first electroconductive layer 12, the dielectric layer 13, the second electroconductive layer 14, the light-emitting layer 15 and the third electroconductive layer 16. Usually, a material that satisfies mechanical strength required for a support body of the electroluminescent element 10 is used for the substrate 11.

The material for the substrate 11, in the case where the light is to be taken out from the substrate 11 side of the electroluminescent element 10 (that is, in the case where the surface of the substrate 11 side is the light-emitting surface from which the light is taken out), is preferably a material that is transparent to the wavelength of light emitted in the light-emitting layer 15. Specifically, in a case where the light emitted in the light-emitting layer 15 is visible light, for example: glasses such as soda glass and non-alkali glass; transparent plastics such as acrylic resins, methacrylic resins, polycarbonate resins, polyester resins and nylon resins; silicon and the like are provided.

It should be noted that, in the exemplary embodiment, "transparent to the wavelength of light emitted in the light-emitting layer 15" means that it is enough to transmit light with a constant wavelength range emitted from the light-emitting layer 15, and it is unnecessary to have optical transparency over the entire visible light region.

In a case where it is unnecessary to take out light from a surface on the substrate 11 side of the electroluminescent element 10, the material of the substrate 11 is not limited to the ones which are transparent, and opaque materials can be used. Specifically, in addition to the above-described materials, a material composed of: a simple substance such as copper, silver, gold, platinum, tungsten, titanium, tantalum or niobium; alloys thereof; stainless steel or the like; can be used.

(First Electroconductive Layer 12)

Upon application of a voltage between the first electroconductive layer 12 and the third electroconductive layer 16, the first electroconductive layer 12 injects holes to the light-emitting layer 15 via the second electroconductive layer 14. In other words, in the exemplary embodiment, the first electroconductive layer 12 is an anode layer. A material used for the first electroconductive layer 12 is not particularly limited as long as the material has electric conductivity.

For example, conductive metal oxides, metals, alloys or the like can be provided. Here, as the conductive metal oxides, for example, indium tin oxide (ITO), indium zinc oxide (IZO), tin oxide, zinc oxide, and so on are provided. As the metals, stainless steel, copper, silver, gold, platinum, tungsten, titanium, tantalum, niobium, and the like are provided. Moreover, alloys including these metals can also be used. Of these materials, as the transparent materials used for forming a transparent electrode, ITO, IZO and tin oxide are preferable. In addition, a transparent conductive film composed of organic substances such as polyaniline or derivatives thereof, polythiophene or derivatives thereof and the like may be used.

The thickness of the first electroconductive layer 12 is, in the case where the surface on the substrate 11 side of the electroluminescent element 10 becomes the light-emitting surface, from which light is taken out, preferably 2 nm to 300 nm for obtaining high optical transparency. Moreover, in the case where there is no need to take out light from the substrate 11 side of the electroluminescent element 10, for example, the first electroconductive layer 12 may be formed with a thickness of 2 nm to 2 mm.

It should be noted that, for the substrate 11, a material same as that of the first electroconductive layer 12 can also be used. In this case, the substrate 11 may serve as the first electroconductive layer 12.

(Dielectric Layer 13)

The dielectric layer 13 is laminated on the first electroconductive layer 12, and a material transparent to the light emitted in the light-emitting layer 15 is used.

As specific materials constituting the dielectric layer 13, for example, metal nitrides such as silicon nitride, boron nitride and aluminum nitride, and metal oxides such as silicon oxide and aluminum oxide are provided. Further, polymer compounds such as polyimide, polyvinylidene fluoride and parylene can also be used.

It is preferable that the thickness of the dielectric layer 13 does not exceed 1 μm for suppressing increase of electrical resistance between the first electroconductive layer 12 and the second electroconductive layer 14. It is preferable to form the dielectric layer 13 with a thickness of 10 nm to 500 nm, and further preferable, to form with a thickness of 50 nm to 200 nm.

It should be noted that the shape of the contact hole 17 formed to pass through the dielectric layer 13 is not particularly limited, and the shape may be, for example, a cylindrical shape, a quadrangular prism shape, or the like.

Moreover, in the exemplary embodiment, the contact hole 17 is formed to pass through the dielectric layer 13 only; however, not limited to the exemplary embodiment. For example, the contact hole 17 may be formed to further pass through the first electroconductive layer 12.

(Second Electroconductive Layer 14)

The second electroconductive layer 14 electrically contacts the first electroconductive layer 12 inside the contact hole 17 to inject the holes received from the first electroconductive layer 12 into the light-emitting layer 15. It is preferable that the second electroconductive layer 14 includes conductive metal oxides or conductive polymers. Specifically, the second electroconductive layer 14 is preferably a transparent conductive film, which has optical transparency, composed of conductive metal oxides, such as ITO, IZO and tin oxide, and organic substances, such as conductive polymer compounds.

Moreover, in the exemplary embodiment, since the inside of the contact hole 17 is filled with a material to form the second electroconductive layer 14, it is preferable that the second electroconductive layer 14 is formed by coating for making it easy to form a film on an inner surface of the contact hole 17. Accordingly, from this point of view, it is especially preferable that the second electroconductive layer 14 is a transparent conductive film composed of organic substances, such as conductive polymer substances. It should be noted that the second electroconductive layer 14 and the first electroconductive layer 12 may be formed by use of the same material.

The thickness of the second electroconductive layer 14 is, in the case where the light is to be taken out from a surface on the substrate 11 side, preferably 2 nm to 300 nm for obtaining high optical transparency.

Moreover, in the exemplary embodiment, a layer for facilitating injection of the holes into the light-emitting layer 15 (for example, a hole injection layer, etc.) may be provided on a surface of the second electroconductive layer 14 that is brought into contact with the light-emitting layer 15. As such a layer, specifically, a layer of 1 nm to 200 nm composed of conductive polymers, such as phthalocyanine derivatives, polythiophene derivatives and the like, amorphous carbon, carbon fluoride, polyamine compound and the like, or a layer having an average thickness of not more than 10 nm composed of metal oxides, metal fluorides, organic insulating materials and the like, are provided.

(Light-Emitting Layer 15)

The light-emitting layer 15 includes a light-emitting material that emits light by application of a voltage. As the light-emitting material contained in the light-emitting layer 15, any of organic materials and inorganic materials can be used. In the case of organic materials (luminescent organic materials), any of low-molecular compounds (luminescent low-molecular compounds) and polymer compounds (luminescent polymer compounds) can be used. As luminescent organic materials, phosphorescent organic compounds and metal complexes are preferred.

In the exemplary embodiment, from the viewpoint of improving the light-emitting efficiency of the light-emitting layer 15, it is particularly preferable to use cyclometalated complexes. As the cyclometalated complexes, for example, complexes of iridium, palladium, platinum and the like including ligands such as 2-phenylpyridine derivatives, 7,8-benzoquinoline derivatives, 2-(2-thienyl) pyridine derivatives, 2-(1-naphthyl) pyridine derivatives, 2-phenylquinoline derivatives are provided. Of these, iridium complexes are especially preferred. The cyclometalated complexes may include ligands other than the ligands required to form the cyclometalated complexes.

As the luminescent polymer compounds, for example, there are provided: polymer compounds of a n-conjugated system, such as poly-p-phenylenevinylene (PPV) derivatives, polyfluorene derivatives and polythiophene derivatives; polymers introducing low-molecular pigments and tetraphenyldiamine or triphenylamine to a main chain or a side chain; and the like. The luminescent polymer compounds and the luminescent low-molecular compounds can be used in combination.

The light-emitting layer 15 includes the light-emitting material and a host material, and the light-emitting material is dispersed in the host material in some cases. It is preferable that the host material has charge transporting properties, and it is also preferable that the host material is a hole-transporting compound or an electron-transporting compound. It should be noted that, as the hole-transporting compound or the electron-transporting compound, a known material can be used.

The thickness of the light-emitting layer 15 is appropriately selected in consideration of charge mobility, balance of injected charge or interference of emitting light and the like, and is not particularly limited. In the exemplary embodiment, the thickness of the light-emitting layer 15 is preferably 1 nm to 1 μm, more preferably 2 nm to 500 nm, and especially preferably 5 nm to 200 nm.

(Third Electroconductive Layer 16)

A voltage is applied between the third electroconductive layer 16 and the first electroconductive layer 12 and the electrons are injected from the third electroconductive layer 16 to the light-emitting layer 15. In other words, in the exemplary embodiment, the third electroconductive layer 16 is a cathode layer.

A material used for the third electroconductive layer 16 is, similar to that of the first electroconductive layer 12, not particularly limited as long as the material has electric conductivity. In the exemplary embodiment, it is preferable that the material has a low work function and is chemically stable. Specifically, Al, alloys of Al and alkali metals, such as AlLi, alloys of Al and Mg, such as MgAl alloy, alloys of Al and alkaline earth metals, such as AlCa, and the like can be provided as specific examples.

However, in the case where the light is to be taken out from the third electroconductive layer 16 side of the electroluminescent element 10 (namely, in the case where the surface of the third electroconductive layer 16 side becomes the light-emitting surface, from which the light is to be taken out), it is preferable to use a material transparent to the emitted light as the material for the third electroconductive layer 16, similar to the first electroconductive layer 12.

The thickness of the third electroconductive layer 16 is preferably 0.01 µm to 1 µm, and more preferably 0.05 µm to 0.5 µm.

In the exemplary embodiment, with intent to lower the barrier for the electron injection from the third electroconductive layer 16 into the light-emitting layer 15, to thereby increase the electron injection efficiency, a cathode buffer layer (not shown) may be provided adjacent to the third electroconductive layer 16. The cathode buffer layer is required to have a lower work function than the third electroconductive layer 16, and metallic materials may be suitably used therefor. As such metallic materials, for example, alkali metals (Na, K, Rb and Cs), Mg and alkaline earth metals (Sr, Ba and Ca), rare earth metals (Pr, Sm, Eu and Yb), one selected from fluoride, chloride and oxide of these metals and mixture of two or more selected therefrom can be used. The thickness of the cathode buffer layer is preferably 0.05 nm to 50 nm, more preferably 0.1 nm to 20 nm, and still more preferably 0.5 nm to 10 nm.

Moreover, in the exemplary embodiment, a layer other than the light-emitting layer 15 may be formed between the second electroconductive layer 14 and the third electroconductive layer 16. As such a layer, for example, a hole transporting layer, a hole blocking layer, an electron transporting layer or the like can be provided. Each layer is formed, in response to the function thereof, by use of a known charge transporting material or the like. Moreover, the thickness of each layer is appropriately selected in consideration of charge mobility, balance of injected charge or interference of emitting light and the like, and is not particularly limited. In the exemplary embodiment, the thickness of each layer is preferably 1 nm to 500 nm, and more preferably, 5 nm to 200 nm.

(Contact Hole 17)

Figure 2A:
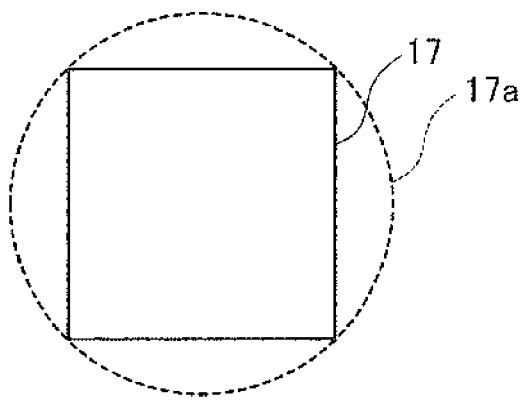
FIGS. 2A and 2B are diagrams illustrating a size of a contact hole.
Figure 2B:
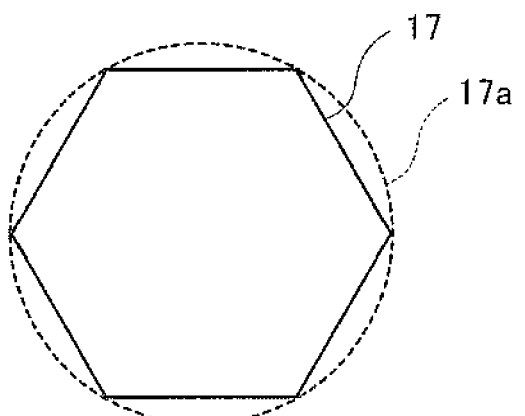

FIGS. 2A and 2B are diagrams illustrating a size of the contact hole 17. FIG. 2A shows, for example, a case in which the contact hole 17 has a cross-sectional shape of a square as the light-emitting surface of the light-emitting layer 15 is viewed in a plan view from a perpendicular direction with respect to the substrate 11, and FIG. 2B shows a case in which the cross-sectional shape thereof is a hexagon. In the exemplary embodiment, as shown in FIGS. 2A and 2B, the size of the contact hole 17 is represented by use of a diameter of a minimum circle 17a enclosing the above-described shape of the contact hole 17 (the minimum enclosing circle) in the case of viewing the contact hole 17 in a plan view.

In the exemplary embodiment, from the viewpoint of increasing the area of the light-emitting layer 15 to be formed on the dielectric layer 13 and luminance of the electroluminescent element 10, the size of the contact hole 17 is preferably as small as possible as long as electrical connection between the first electroconductive layer 12 and the second electroconductive layer 14 is fully available.

From the viewpoint like this, the diameter of the minimum enclosing circle 17a is preferably 0.01 µm to 2 µm. For example, in the case where the contact hole 17 has a cylindrical shape, the diameter of the cylinder is preferably 0.01 µm to 2 µm.

In the exemplary embodiment, in the case where the dielectric layer 13 is viewed in the plan view from the light-emitting surface side of the light-emitting layer 15, the ratio of the total area occupied by the plural contact holes 17 to the area of the light-emitting region is preferably not more than 0.2, and especially preferably 0.001 to 0.1. In the case where the ratio of the total area occupied by the contact holes 17 is within the above-described range, it becomes easy to correct temperature unevenness.

In the exemplary embodiment, the number of the contact holes 17 to be formed in one light-emitting region is at least not less than $10^2$, and preferably not less than $10^4$. However, it is preferable that the number of contact holes 17 is such that, as described above, the ratio of the total area of the contact holes 17 in the light-emitting region surface is preferably in the range of not more than 0.2. It should be noted that, since FIG. 1 is a schematic view, it is not necessarily assumed to represent the ratio of each value.

In the exemplary embodiment, the plural contact holes 17 may be distributed uniformly or non-uniformly in the light-emitting region with a desired light-emitting mode. Moreover, the plural contact holes 17 in the light-emitting region may be arranged regularly or irregularly. However, in view of manufacturing, it is preferable that the plural contact holes 17 are arranged regularly. As a specific example of regular arrangement, for example, an arrangement of a cubic lattice or a hexagonal lattice can be provided. With such an arrangement, in the electroluminescent element 10 to which the exemplary embodiment is applied, a light-emitting portion is formed on the smooth dielectric layer 13, and it is possible to increase uniformity in light emission in the light-emitting region.

It should be noted that, in the above-described specific example, description was given of the case where the first electroconductive layer 12 was assumed to be the anode layer and the third electroconductive layer 16 was assumed to be the cathode layer; however, the specific example is not limited thereto, and the first electroconductive layer 12 may be the cathode layer and the third electroconductive layer 16 may be the anode layer.

<Manufacturing Method for Electroluminescent Element>

Next, description will be given of a manufacturing method for an electroluminescent element, while the electroluminescent element 10 shown in FIG. 1 is taken as a specific example.

(First Electroluminescent Element Manufacturing (Hereinafter, Referred to as "First Manufacturing Step"))

FIGS. 3A to 3E are diagrams for illustrating the method for manufacturing the electroluminescent element 10.

Figure 3A:
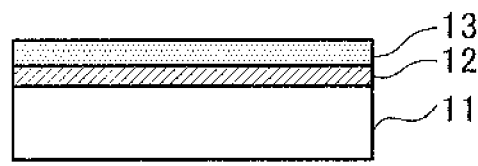
FIGS. 3A to 3E are diagrams illustrating a specific example of a method for manufacturing the electroluminescent element.

First, as shown in FIG. 3A, on the substrate 11, the first electroconductive layer 12 and the dielectric layer 13 are successively laminated. For forming these layers, a resistance heating deposition method, an electron beam deposition method, a sputtering method, an ion plating method, a CVD method or the like can be used. Alternatively, if a coating film-forming method (that is, a method for applying a target material solved in a solvent to the substrate and then drying the same) is applicable, the layers can be formed by a spin coating method, a dip coating method, an ink-jet printing method, a printing method, a spray-coating method and a dispenser-printing method or the like.

Next, the contact holes 17 are formed in the dielectric layer 13. For forming the contact holes 17, a method using photolithography may be provided, for example.

Figure 3B:
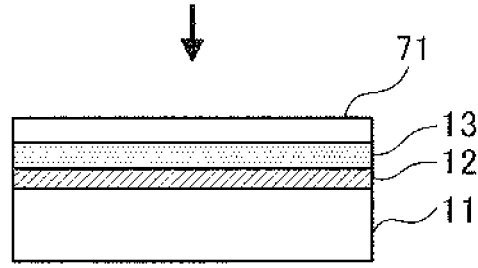

As shown in FIG. 3B, first, a photoresist solution is applied on the dielectric layer 13 and then an excess photoresist solution is removed by spin coating or the like to form a photoresist layer 71.

Figure 3C:
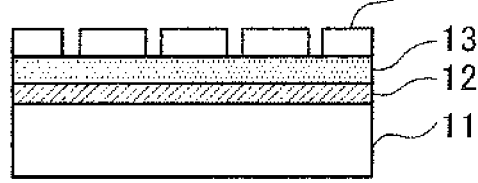

Subsequently, as shown in FIG. 3C, the photoresist layer 71 is covered with a mask, in which a predetermined pattern for forming the contact holes 17 is rendered, and is exposed with ultraviolet (UV), an electron beam (EB) or the like. Here, by performing same magnification exposure (for example, in a case of contact exposure or proximity exposure), a pattern of the contact holes 17 with the same magnification as the mask pattern can be formed. Moreover, if reduced exposure (for example, in a case of exposure using a stepper) is performed, a pattern of the contact holes 17 which is reduced with respect to the mask pattern can be formed. Next, unexposed portions of the photoresist layer 71 are removed by use of a developing solution, and thereby pattern portions of the photoresist layer 71 are removed and part of the dielectric layer 13 is exposed.

Figure 3D:
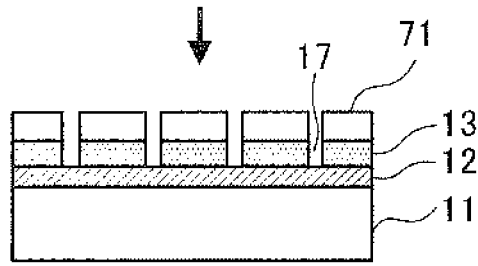

Next, as shown in FIG. 3D, the exposed portions of the dielectric layer 13 are removed by etching to form the contact holes 17. In this case, part of the first electroconductive layer 12 provided below the dielectric layer 13 may also be removed by etching. Either dry etching or wet etching can be used as the etching. Reactive ion etching (RIE) or inductive coupling plasma etching is provided as the dry etching. Moreover, as the wet etching, a method of immersion in diluted hydrochloric acid or diluted sulfuric acid is provided. It should be noted that, in performing etching, by controlling etching conditions (for example, a process time, gases to be used, pressure, and a substrate temperature), the layers to be penetrated by the contact holes 17 can be selected.

Moreover, the contact holes 17 can also be formed by a method of nanoimprinting. Specifically, after forming the photoresist layer 71, a mask in which convex patterns are rendered is pressed against the surface of the photoresist layer 71 with pressure. By applying heat and/or light to the photoresist layer 71 in this state, the photoresist layer 71 is cured. Next, the mask is removed, and thereby the pattern, which is a pattern of the contact holes 17 corresponding to the convex patterns on the mask, is formed on a surface of the photoresist layer 71. Subsequently, the contact holes 17 can be formed by performing the aforementioned etching.

Figure 3E:
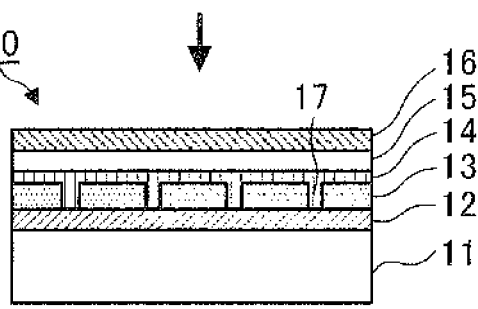

Next, as shown in FIG. 3E, on the dielectric layer 13, on which the contact holes 17 have been formed, the second electroconductive layer 14, the light-emitting layer 15 and the third electroconductive layer 16 are successively laminated. These layers are formed by a method same as that for forming the first electroconductive layer 12 or the dielectric layer 13. It should be noted that, in the exemplary embodiment, it is preferable to form the second electroconductive layer 14 by a coating film-forming method. By employing the coating film-forming method, it is possible to fill the material constituting the second electroconductive layer 14 inside the contact holes 17 with ease.

(Temperature Distribution Measurement Step)

Subsequently, by causing the electroluminescent element 10 manufactured in the first manufacturing step to emit light, temperature distribution is measured. Specifically, a voltage is applied to the electroluminescent element 10 by a DC power supply to cause the electroluminescent element 10 to emit light at a predetermined average luminance, to thereby measure the temperature distribution by use of an infrared thermography. The more the sampling number of the electroluminescent element 10 for measuring the temperature distribution, the more accurately the temperature distribution can be measured. In the exemplary embodiment, it is preferable to measure not less than 10 electroluminescent elements 10, and more preferable to measure all of the electroluminescent elements 10.

By measuring the temperature distribution, as temperature unevenness information, temperature in each part of the electroluminescent element 10 that has been caused to emit light (hereinafter, also referred to as "partial temperature"), the highest temperature ($T_H$), the lowest temperature ($T_L$) and the average temperature ($T_A$) are obtained.

Next, based on the temperature unevenness information obtained by measurement of the temperature distribution, temperature unevenness (difference in temperature ($T_H$-$T_L$) between the highest temperature ($T_H$) and the lowest temperature ($T_L$)) of the electroluminescent element 10 that has been caused to emit light is calculated by the following mathematical expression (1). It should be noted that all units used in the exemplary embodiment is ° C.

$$\text{Temperature unevenness}=(T_H-T_L) \quad (1)$$

Subsequently, in a case where the temperature unevenness calculated by the mathematical expression (1) is larger than a predetermined threshold value, the temperature unevenness information of the electroluminescent element 10 manufactured in the first manufacturing step is fed back to the following manufacturing (the second manufacturing step). It should be noted that, to avoid reduction in life of the electroluminescent element 10, the threshold value is preferably not more than 3° C., and more preferably, not more than 1° C.

(Second Electroluminescent Element Manufacturing (Hereinafter, Referred to as "Second Manufacturing Step"))

In the second manufacturing step, similar to the above-described first manufacturing step, the first electroconductive layer 12 and the dielectric layer 13 are successively laminated on the substrate 11, and subsequently, plural contact holes 17 are formed in the dielectric layer 13 by photolithography.

In the second manufacturing step, based on the measurement value of temperature that has been fed back as the temperature unevenness information of the electroluminescent element 10 manufactured in the first manufacturing step, a density of the plural contact holes 17 is adjusted.

The partial temperature of the emitting electroluminescent element 10 is susceptible to the density of the contact holes 17 more than the size, shape or the like thereof, and accordingly, to control the temperature distribution, it is preferable to control the density of the plural contact holes 17 that pass through the dielectric layer 13.

Figure 4:
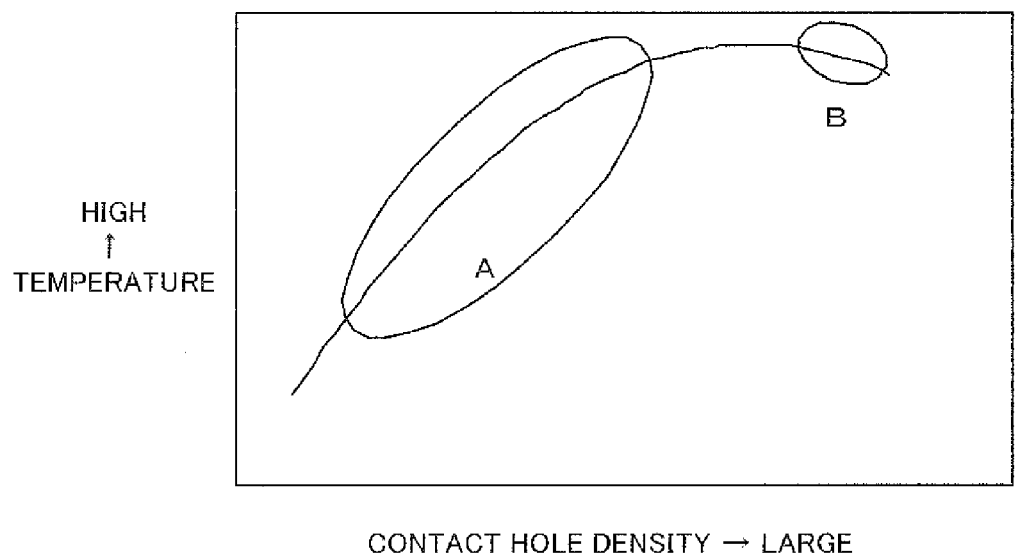
FIG. 4 is a diagram illustrating a relation between a density of contact holes and temperature in the electroluminescent element that is emitting.

FIG. 4 is a diagram illustrating a relation between the density of the contact holes 17 and temperature of the electroluminescent element 10 that is emitting.

In FIG. 4, region A indicates a region where, as the density of the contact holes 17 increases, the partial temperature of the electroluminescent element 10 also increases. Moreover, region B indicates a region where, as the density of the contact holes 17 increases, the partial temperature of the electroluminescent element 10 decreases. Conditions for making region A or region B like these can be obtained by measuring a relation between the density of the contact holes 17 and the temperature in advance by a preliminary experiment.

To adjust the density of the contact holes 17 to make the temperature distribution uniform, for example, in region A, based on the measurement value of temperature that has been fed back as the temperature unevenness information of the electroluminescent element 10 manufactured in the first manufacturing step, when the contact holes 17 are formed, operations of decreasing the density of the contact holes 17 in a portion where the temperature is higher than the average temperature ($T_A$) and increasing the density of the contact holes 17 in a portion where the temperature is lower than the average temperature ($T_A$) are carried out.

Similarly, in region B, based on the measurement value of temperature that has been fed back as the temperature unevenness information, when the contact holes 17 are formed, operations of increasing the density of the contact holes 17 in a portion where the temperature is higher than the average temperature ($T_A$) and decreasing the density of the contact holes 17 in a portion where the temperature is lower than the average temperature ($T_A$) are carried out.

In this manner, the temperature unevenness information obtained by the temperature distribution measurement is fed back to the subsequent step (second manufacturing step), to thereby perform adjustment to increase or decrease the density of the contact holes 17 in specific portions in the electroluminescent element 10 to be manufactured. The range in which the density of the contact holes 17 is increased or decreased may be, usually, a range in which the temperature unevenness obtained by the mathematical expression (1) does not diverge, but converges, and is usually, preferably increased or decreased in a range of 1% to 10%. By adjusting the density of the contact holes 17 in the range like this, the temperature unevenness of the electroluminescent element 10 is averaged. Specifically, the photoresist layer coated and formed on the dielectric layer 13 is exposed, for example, by a stepper exposure device while changing a scale of the mask per each predetermined portion and adjusting the density of the contact holes 17.

Figure 5:
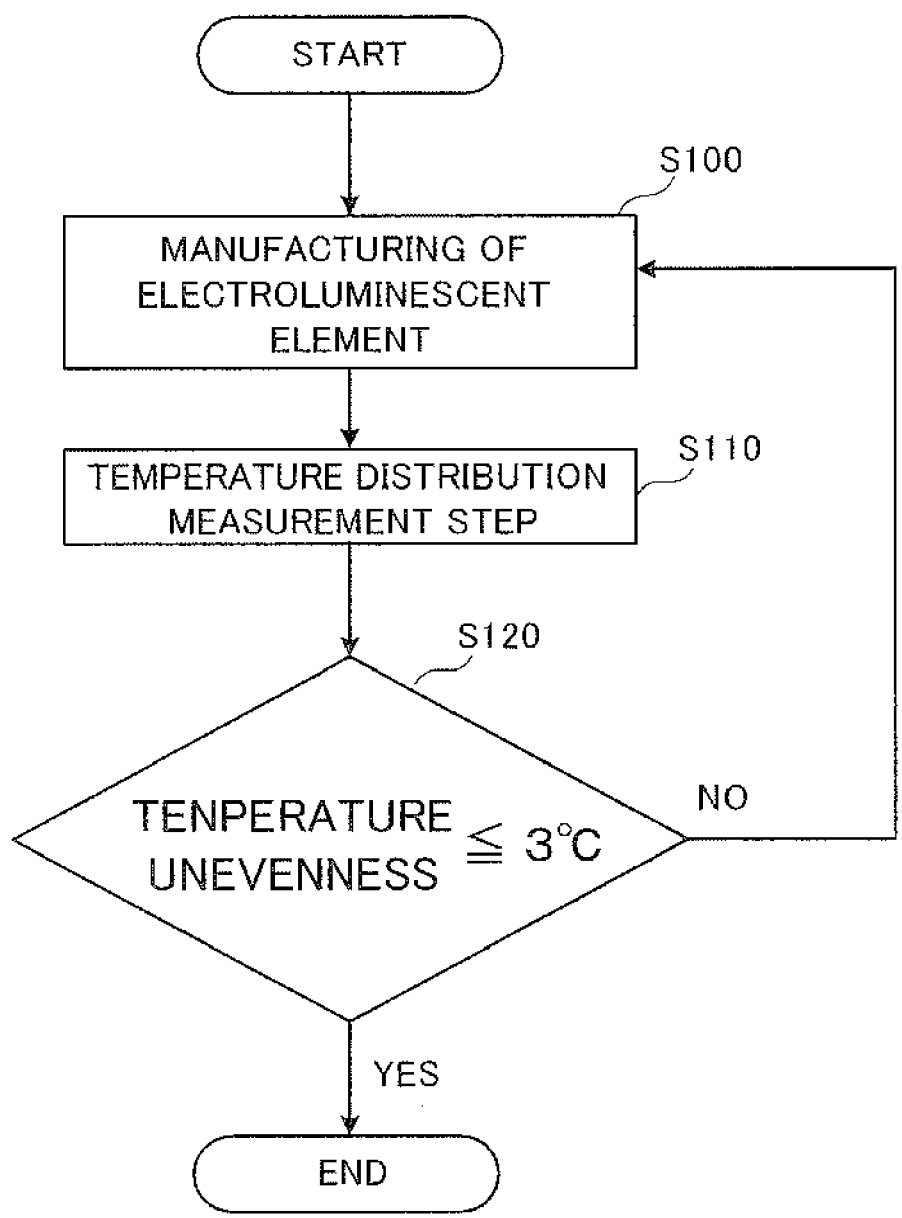
FIG. 5 is a flowchart illustrating a flow in a manufacturing method for the electroluminescent element, to which an exemplary embodiment is applied.

FIG. 5 is a flowchart illustrating a flow in the manufacturing method for the electroluminescent element 10, to which an exemplary embodiment is applied.

In the manufacturing method for the electroluminescent element, as the first manufacturing step, the electroluminescent element 10, in which, on the substrate 11, the first electroconductive layer 12 (anode), the dielectric layer 13 with the plural contact holes 17 formed therein, the second electroconductive layer 14 that is electrically connected to the first electroconductive layer 12 inside the contact holes 17 and fills the contact holes, the light-emitting layer 15 and the third electroconductive layer 16 (cathode) are successively laminated, is manufactured (step 100).

Subsequently, as the temperature distribution measurement step, the electroluminescent element 10 manufactured in the first manufacturing step is caused to emit light, to thereby measure the temperature distribution of the electroluminescent element 10 and obtain the temperature unevenness information (step 110). The temperature unevenness information includes the highest temperature ($T_H$), the lowest temperature ($T_L$) and the average temperature ($T_A$) of the electroluminescent element 10 that has been caused to emit light. Then, based on the obtained temperature unevenness information, by the above-described mathematical expression (1), temperature unevenness of the electroluminescent element 10 that has been caused to emit light is calculated.

Next, it is determined whether or not the temperature unevenness calculated in the temperature distribution measurement step exceeds the predetermined threshold value (in the exemplary embodiment, set to 3° C.) (step 120). In the case where the temperature unevenness exceeds the threshold value (NO), the electroluminescent element 10 is manufactured while the temperature unevenness information is fed back to the first manufacturing step and the density of the plural contact holes 17 passing through the dielectric layer 13 is adjusted (the second manufacturing step).

Then, in the temperature distribution measurement step again, the temperature distribution of the electroluminescent element 10 manufactured in the second manufacturing step is measured to determine whether or not the obtained temperature unevenness exceeds the threshold value, and in the case where the temperature unevenness exceeds the threshold value, the temperature unevenness information is fed back to the first manufacturing step, and the step of adjusting the density of the contact holes 17 is repeated until the temperature unevenness becomes not more than the threshold value.

With the above steps, the electroluminescent element 10 can be manufactured. It should be noted that, in the case where the electroluminescent element 10 is stably used for long periods, it is preferable to mount a protective layer or a protective cover (not shown) for protecting the electroluminescent element 10 from the outside. As the protective layer, polymer compounds, metal oxides, metal fluorides, metal borides, or silicon compounds such as silicon nitrides and silicon oxides can be used. Then, a lamination thereof can also be used. As the protective cover, glass plates, plastic plates with a surface treated with low hydraulic permeability, metals or the like can be used.

The electroluminescent element 10 to which the exemplary embodiment is applied can be used in, for example, a display device, an illumination device and the like.

Though not particularly limited, as the display device, a so-called passive matrix display device is provided.

Moreover, usually, by a lighting circuit including a DC power supply and a control circuit inside thereof, an illumination device supplies a current between the first electroconductive layer 12 and the third electroconductive layer 16 of the electroluminescent element 10, to thereby cause the light-emitting layer 15 to emit light. The light emitted in the light-emitting layer 15 is taken to the outside through the substrate 11, and is utilized for illumination.

EXAMPLES

Hereinafter, the present invention will be described in further detail based on Examples. However, the present invention is not limited to the following Examples.
(Preparation of Electroluminescent Element)

With the following method, the electroluminescent element 10 was prepared.

First, on a glass substrate made of quartz glass (the substrate 11: 25 mm per side, a thickness of 1 mm), the first electroconductive layer 12 configured with an ITO film with a thickness of 150 nm and the dielectric layer 13 configured with a silicon dioxide ($SiO_2$) film with a thickness of 50 nm were formed by successive lamination by use of a sputtering device (E-401s manufactured by Canon ANELVA Corporation). Subsequently, on the dielectric layer 13, a photoresist (AZ1500 manufactured by AZ Electronic Materials) layer 71 with a thickness of about 1 μm was formed by a spin coating method.

Subsequently, with a quartz (with a thickness of 3 mm) as a base material, a mask A corresponding to a pattern in which circles were arranged on hexagonal lattices was prepared, and the photoresist layer 71 was exposed on a scale of ⅕ by use of a stepper exposure device (model NSR-1505i6 manufactured by Nikon Corporation). Next, the exposed photoresist layer 71 was developed with 1.2% aqueous solution of tetramethyl ammonium hydroxide ((TMAH): $(CH_3)_4NOH$) for patterning the photoresist layer 71, and thereafter, heat at a temperature of 130° C. was applied for 10 minutes (post-baking process).

Next, by a reactive ion etching device (RIE-200iP manufactured by SAMCO Inc.), a dry etching process was applied on the photoresist layer 71 by causing a reaction for 18 minutes with $CHF_3$ as a reactant gas under conditions of a pressure of 0.3 Pa and output bias/ICP=50/100 (W). Next, the residue of the photoresist was removed by a photoresist removing solution, and thereby the plural contact holes 17 passing through the dielectric layer 13 configured with the $SiO_2$ layer were formed. The contact hole 17 had a cylindrical shape with a diameter of 1 μm, and the contact holes 17 were arranged in a hexagonal lattice with a 4-μm pitch on an entire surface of the dielectric layer 13.

Subsequently, on the dielectric layer 13, an aqueous suspension (1.5% by mass in content) of a mixture of poly(3,4-ethylendioxythiophene) (PEDOT) and polystyrene sulfonate (PSS) (PEDOT:PSS=1:6 in mass ratio) was applied by the spin coating method (spin rate: 3000 rpm), and being left under a nitrogen atmosphere at the temperature of 140° C. for an hour to be dried, and accordingly, the second electroconductive layer 14 with a thickness of 20 nm was formed on the dielectric layer 13.

Next, on the second electroconductive layer 14, a xylene solution of 1.1% by mass in content of a compound (A) indicated below was applied by the spin coating method (spin rate: 3000 rpm), and left under a nitrogen atmosphere at the temperature of 210° C. for an hour to be dried, and thereby a hole transport layer with a thickness of 20 nm was formed.

Subsequently, on the above-described hole transport layer, a xylene solution (a solid content concentration is 1.6% by mass) including a compound (B), a compound (C) and a compound (D) indicated below with mass ratio of 9:1:90 was applied by the spin coating method (spin rate: 3000 rpm), and left under a nitrogen atmosphere at the temperature of 140° C. for an hour to be dried, and thereby the light-emitting layer 15 with a thickness of 50 nm was formed.

[Chemical Formula 1]

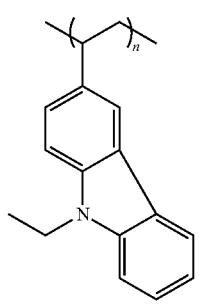

Compound (A)

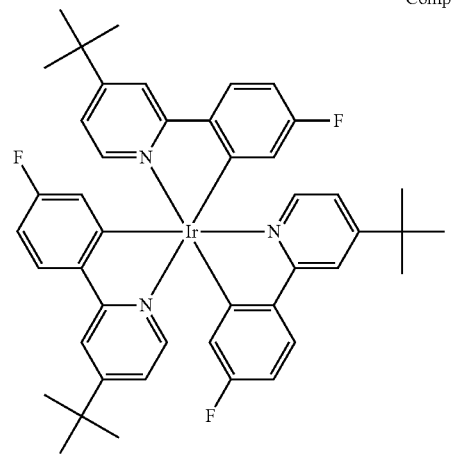

Compound (B)

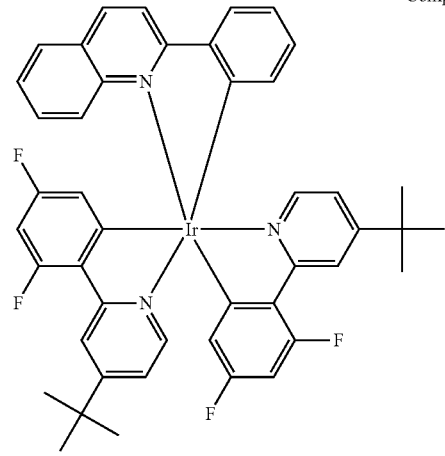

Compound (C)

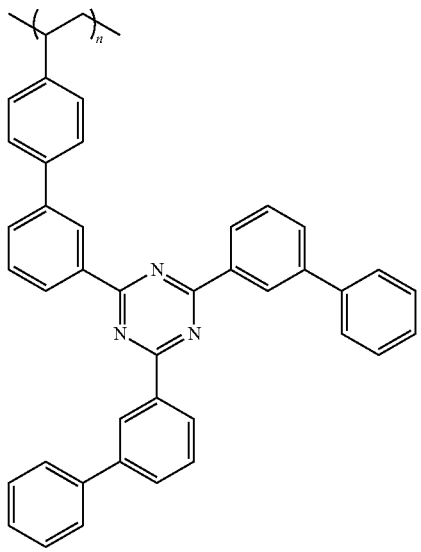

Compound (D)

Further, by a deposition method, on the above-described light-emitting layer 15, the cathode buffer layer composed of sodium fluoride (with a thickness of 4 nm) and the third electroconductive layer 16 composed of aluminum (with a thickness of 130 nm) were formed, to thereby prepare the electroluminescent element 10.

The prepared electroluminescent element 10 has a light-emitting surface on the substrate 11 side of the light-emitting layer 15 and includes one continuous light-emitting region. Moreover, when the electroluminescent element 10 was observed (viewed in a plan view) from the light-emitting surface side, the number of plural contact holes 17 in the above-described light-emitting region was about $2\times10^7$. The ratio of the total area occupied by the plural contact holes 17 to the area of the light-emitting region was 0.057. With the above-described operations, 10 electroluminescent elements 10 were prepared per one batch.

It should be noted that the obtained electroluminescent element 10 was an element having properties included in the above-described region A.

(Measurement of Temperature Distribution)

Subsequently, each of these 10 electroluminescent elements 10 was caused to emit light, and the temperature distribution was measured. The measurement of temperature distribution was carried out by applying a voltage to the electroluminescent element 10 bonded to a vertical plaster board by a DC power supply (model SM2400 manufactured by Keithley Instruments Inc.) to cause the electroluminescent element 10 to be lighted at an average luminance of 300 cd/m², with an infrared thermography.

By the measurement of temperature distribution, the highest temperature ($T_H$), the lowest temperature ($T_L$) and the average temperature ($T_A$) were obtained as the temperature unevenness information.

Subsequently, based on the temperature unevenness information obtained by the temperature distribution measurement of the 10 electroluminescent elements 10 prepared in the first one batch, the temperature unevenness obtained by the above-described mathematical expression (1) (temperature unevenness=($T_H-T_L$)) was 6° C. It should be noted that the temperature unevenness is an average value of the measurement results in the 10 electroluminescent elements 10.

The temperature unevenness obtained by the temperature distribution measurement of the 10 electroluminescent elements 10 prepared in the first one batch was 6° C., which was larger than the threshold value of the temperature unevenness (in the exemplary embodiment, set to 1° C.).

Accordingly, the temperature unevenness information obtained by the above-described temperature distribution measurement (the partial temperature, $T_H$, $T_L$ and $T_A$) was fed back to the manufacturing step of the electroluminescent element 10, and the electroluminescent element 10 was manufactured while adjusting the density of the plural contact holes 17 so that the temperature distribution of the emitting electroluminescent element 10 became uniform.

Specifically, the photoresist layer was coated and formed on the dielectric layer 13, and subsequently, by use of a predetermined mask, exposure was performed by a stepper exposure device while adjusting the density of the contact holes 17 per each portion of 5 mm square. Adjustment of the density of the contact holes was carried out by increasing or decreasing the scale of the mask by 2% based on the temperature of the portion corresponding to the exposed portion that was measured in the temperature distribution measurement.

The above-described operation was repeated until the temperature unevenness based on the temperature unevenness information per each batch became not more than the threshold value (1° C.), and accordingly, the electroluminescent element 10 was manufactured. The results are shown in Table 1.

TABLE 1

| Number of batches | First batch | Third batch | Tenth batch |
|---|---|---|---|
| Temperature Unevenness (° C.) | 6 | 3 | <1 |
| Usable time | 100 hr | 1000 hr | 5000 hr |

Moreover, in FIG. 6, diagrams illustrating the temperature distribution of the electroluminescent element 10 were shown.

FIG. 6A is a diagram illustrating the temperature distribution of the electroluminescent element 10 in the first batch. As shown in FIG. 6A, in the electroluminescent element 10, it is learned that a high-temperature portion of the highest temperature is measured at a center portion and a low-temperature portion of the lowest temperature is measured at a peripheral portion, and the temperature distribution is generated between the high-temperature portion and the low-temperature portion in the electroluminescent element 10 that was caused to emit light.

FIG. 6B is a diagram illustrating the temperature distribution of the electroluminescent element 10 in the third batch. It is leaned that, in comparison with the first batch (FIG. 6A), the temperature distribution is decreased.

FIG. 6C is a diagram illustrating the temperature distribution of the electroluminescent element 10 in the tenth batch. It is leaned that, in comparison with the third batch (FIG. 6B), the temperature distribution is further decreased.

From the results shown in Table 1, it is learned that, by manufacturing the electroluminescent element 10 while performing feedback of the temperature unevenness information obtained in each batch to the next manufacturing step, the temperature unevenness is reduced to 0.03 and the temperature distribution in the light-emitting surface is decreased.

Further, it is learned that, by the decrease of the temperature unevenness, the usable time (life) of the electroluminescent element 10 becomes 5000 hours, which is elongated 50 times compared to the life of the electroluminescent element 10 manufactured in the first batch. It should be noted that the usable time means a time in which the luminance is reduced by half compared to an initial stage of lighting when the electroluminescent element 10 is lighted by passing a current of 10 mA per the light-emitting surface of 1 cm².

REFERENCE SIGNS LIST

10 . . . Electroluminescent element
11 . . . Substrate
12 . . . First electroconductive layer
13 . . . Dielectric layer
14 . . . Second electroconductive layer
15 . . . Light-emitting layer
16 . . . Third electroconductive layer
17 . . . Contact hole
17a . . . Minimum enclosing circle
110 . . . Lamination section

The invention claimed is:

1. A manufacturing method for an electroluminescent element comprising:
    first manufacturing of an electroluminescent element (a first manufacturing step) that manufactures an electroluminescent element in which, on a substrate, a first electroconductive layer, a dielectric layer with a plurality of contact holes passing through in a direction orthogonal to the substrate formed therein, a second electroconductive layer that is electrically connected to the first electroconductive layer inside the contact holes and fills the contact holes, a light-emitting layer and a third electroconductive layer are successively laminated;

a temperature distribution measurement step that applies a voltage to the first electroconductive layer and the third electroconductive layer of the electroluminescent element manufactured in the first manufacturing step to cause the light-emitting layer to emit light, and measures temperature distribution of the electroluminescent element to obtain temperature unevenness information of the electroluminescent element; and second manufacturing of an electroluminescent element (a second manufacturing step) that adjusts a density of the plurality of contact holes passing through the dielectric layer based on the temperature unevenness information, to thereby reduce temperature unevenness of the electroluminescent element.

2. The manufacturing method for an electroluminescent element according to claim 1, wherein, in the temperature distribution measurement step, as the temperature unevenness information, a highest temperature ($T_H$) and a lowest temperature ($T_L$) of the electroluminescent element caused to emit light are measured.

3. The manufacturing method for an electroluminescent element according to claim 1, wherein, in the temperature distribution measurement step, based on the temperature unevenness information, a difference ($T_H$–$T_L$) between a highest temperature ($T_H$) and a lowest temperature ($T_L$) of the electroluminescent element caused to emit light is obtained as temperature unevenness.

4. The manufacturing method for an electroluminescent element according to claim 3, wherein, in the temperature distribution measurement step, a threshold value is set to not more than 3° C., and in a case where the temperature unevenness is more than the threshold value, the temperature unevenness information is fed back to the first manufacturing step.

5. The manufacturing method for an electroluminescent element according to claim 1, wherein, in the first manufacturing step and the second manufacturing step, the plurality of contact holes are formed so that a number of the contact holes is not less than $10^2$ per a light-emitting region based on light emission in the light-emitting layer, and a ratio of a total area occupied by the plurality of contact holes to an area of the light-emitting region is not more than 0.2.

* * * * *